United States Patent [19]

Alter

[11] Patent Number: 5,254,486
[45] Date of Patent: Oct. 19, 1993

[54] METHOD FOR FORMING PNP AND NPN BIPOLAR TRANSISTORS IN THE SAME SUBSTRATE

[75] Inventor: Martin J. Alter, Los Altos, Calif.

[73] Assignee: Micrel, Incorporated, Sunnyvale, Calif.

[21] Appl. No.: 840,721

[22] Filed: Feb. 21, 1992

[51] Int. Cl.$^5$ .................. 0834 21/265; 0834 29/70
[52] U.S. Cl. ........................... 437/31; 437/27; 437/32; 257/555; 257/556; 257/574; 257/575
[58] Field of Search ............ 437/31, 27, 32, 154; 257/555, 556, 574, 575

[56] References Cited

U.S. PATENT DOCUMENTS 4,403,395  9/1983  Curran ............................ 437/55

FOREIGN PATENT DOCUMENTS 0263149  11/1986  Japan ............................. 437/55

Primary Examiner—Olik Chaudhuri
Assistant Examiner—Long Pham
Attorney, Agent, or Firm—Skjerven, Morrill, MacPherson, Franklin & Friel

[57] ABSTRACT

In one embodiment, this method forms PNP and NPN transistors in a same epitaxial layer. The P-type regions for both the PNP and the NPN transistors are initially defined using a single masking step. Therefore, the emitter and collector region pattern for the PNP transistor is self-aligned with the base region of the NPN transistor. All the defined regions are then doped to achieve a desired base region concentration. A next masking step forms a layer of resist over the base region, and the remainder of the previous masking pattern is retained to define the emitter and collector regions of the PNP transistor. P-type dopants are then implanted in the previously defined emitter and collector regions to form the heavily doped P++ emitter and collector regions of the PNP transistor. Thus, the P++ emitter and collector regions of the PNP transistor will be self-aligned with the P-type base region of the NPN transistor.

8 Claims, 3 Drawing Sheets

5,254,486

METHOD FOR FORMING PNP AND NPN BIPOLAR TRANSISTORS IN THE SAME SUBSTRATE

FIELD OF THE INVENTION

This invention relates to bipolar transistors and, in particular, to an improved method for forming PNP and NPN bipolar transistors in a same substrate.

BACKGROUND OF THE INVENTION

To decrease the fabrication time and therefore to decrease the cost of forming integrated circuits, the number of masking steps, etching steps, doping steps, and drive-in steps should be held to a minimum. In addition, the number of critical mask alignments, where one mask pattern must be precisely aligned with respect to another mask pattern, should also be held to a minimum to simplify the fabrication process. Therefore, any processes which form circuit components using less and/or simpler process steps than those already used to form the circuit components are very valuable.

It is often desirable to form both PNP and NPN bipolar transistors on a same substrate. When forming a lateral PNP bipolar transistor on a same substrate as an NPN bipolar transistor (whether vertical or lateral), it has been known to form the P+ collector and emitter regions of the lateral PNP transistor using the same masking, doping, and drive-in steps as used to form a P+ base region of the NPN transistor. Such a resulting structure is illustrated in FIG. 1.

Generally, to form the structure of FIG. 1, an N− epitaxial layer 10 is deposited or grown over a P− substrate 12 and N+ buried layer regions 13.

A masking, etching, doping, and drive-in step is used to form the highly conductive and deep P++ isolation region 14, which isolates one portion of epitaxial layer 10 from another portion. Such a portion isolated by isolation region 14 is sometimes referred to as a tub. Isolation region 14 is formed so as to make contact with the underlying P− substrate 12.

After isolation region 14 is formed, a next masking, etching, doping, and drive-in process is conducted to deposit and drive-in P-type dopants to concurrently form the P+ contact region for isolation region 14, the P+ collector and emitter regions of the PNP lateral transistor, and the P+ base region of the NPN transistor. These regions, after drive-in, are identified in FIG. 1 as P+ regions 15, 16, 17, and 18, respectively. Although the cross-section of FIG. 1 shows two collector regions 16, these regions 16 are part of a same ring and are thus considered one region.

Since these P+ regions 15–18 are all formed in the same process, they must all have the same conductivity and depth. It is well known that the efficiency (i.e, gain) of a transistor is increased by providing a more lightly doped base. The efficiency is also increased by providing a more heavily doped emitter region. Therefore, when using the above-described method to form the structure of FIG. 1, a trade-off must be made between the doping concentration of the NPN base region 18 and the doping concentration of the PNP emitter region 17. Therefore, although a desirable NPN base conductivity may be in the range of 100–200 ohms/square, a similar PNP emitter conductivity will result in a very poor high current emitter. Accordingly, the method for forming the structure of FIG. 1 is used where highly efficient PNP and NPN transistors are not required.

After the formation of the P+ regions in FIG. 1, a next masking, etching, doping, and drive-in step is then used to form an N++ contact region 22 (to enable ohmic contact with N− epitaxial layer 10) and to form an N+ emitter region 24 for the NPN transistor.

If a more efficient PNP and NPN transistor are desired to be formed, the emitter region of the PNP transistor must be formed in a separate masking and doping step than used to form the P-type base region of the NPN transistor so that the emitter and base regions will each have the desired doping concentrations. FIGS. 2A–2C illustrate one method for forming the base region and the emitter region in separate masking and doping steps.

In FIG. 2A, after a P++ isolation region 26 is formed, epitaxial layer 10 is masked and etched so as to expose regions designated as 28, 29, and 30 where it is desired to inject P-type dopants (e.g., boron) into the surface of epitaxial layer 10 to form the highly conductive collector and emitter regions for a lateral PNP transistor. The P-type dopants are then injected or otherwise deposited into the exposed surface of the epitaxial layer 10. The deposited dopants are then driven-in. During this drive-in step, the epitaxial layer 10 is oxidized in preparation for a next masking step, since any oxide over regions 28–30 was removed in the previous masking and etching step.

FIG. 2A shows the portion of an oxide layer 32 grown over the non-etched portion of N− epitaxial layer 10 being thicker than the oxide layer 32 grown directly over the various P++ regions 34, 35, and 36.

After this first series of steps illustrated with respect to FIG. 2A, a next masking and etching step is conducted to expose a contact region 37 for the isolation region 26 and to expose the portion of epitaxial layer 10 to the right of isolation region 26 where the P-type base region for the NPN transistor is to be formed. This exposed NPN base region is designated as region 38 in FIG. 2B. P-type dopants are then deposited in the exposed surface portions of epitaxial layer 10 to the desired concentration for the formation of an NPN base region 40 and to increase the P-type doping in the contact region 37.

After this step of depositing dopants, the dopants are driven-in, and the surface of the wafer is again oxidized. This adds more oxide to the already existing layer of oxide 32 shown in FIG. 2A and grows a first layer of oxide 42 over the exposed base region 40 and contact region 37.

To now form the N++ emitter region for the NPN transistor and to optionally form an N++ contact region for the N− epitaxial layer 10, a next masking, etching, and doping step is conducted to form an N++ emitter region 46 in base region 40 and to form an N++ epitaxial layer contact region 48. Typically, N-type phosphorus dopants are used, although arsenic or antimony dopants may be used for certain applications.

After this masking, etching, and doping step, the dopants are then again driven-in, and the surface of the wafer is again oxidized so that additional oxide is again grown over the existing layer of oxide 32, and a first layer of oxide 50 is grown over the exposed N++ regions 46 and 48.

The resulting structure of FIG. 2C has a number of drawbacks associated with it. One drawback is that contact holes through the oxide above each of the regions in epitaxial layer 10 must be patterned and etched so that metal may be deposited and provide ohmic contact to each of the regions. Since the oxide over each of the regions has a different thickness, contact hole etching may result in either an improperly sloped contact over the thinnest oxide or a marginally completed contact etched over the thickest oxide.

Additionally, the alignment of this contact hole mask is critical, since the contact pattern must properly align to all the regions simultaneously. This requires tradeoffs on the contact hole mask alignment with respect to all regions in the surface of epitaxial layer 10. Since N++ emitter region 46, P base region 40, P+ contact region 37, and P++ regions 34-36 are formed using three different masks, the alignment of the contact hole mask to, for example, N++ emitter region 46 will result in a certain amount of non-alignment with base region 40, and the regions 34-37.

Accordingly, there are three masking alignment tolerances that must be strictly adhered to when forming the structure of FIG. 2C. These three masking alignments are all critical for the contact hole mask to properly align with all regions formed in epitaxial layer 10 of FIG. 2C.

Other drawbacks exist which make the process described above time consuming and inefficient.

What is needed is an improved method to form a lateral PNP transistor in a same substrate as an NPN transistor which does not have the above-described drawbacks of prior art methods.

SUMMARY OF THE INVENTION

The invention is an improved method for forming a lateral PNP transistor on a same substrate as an NPN transistor which utilizes self-alignment of the P++ emitter and collector regions of the PNP lateral transistor to the P-type base region of the NPN transistor. Thus, there is one less critical masking alignment in this improved method than in the previous methods use to form similar type PNP and NPN transistors in a single substrate.

Additionally, this improved method results in a same oxide thickness over the various regions of the PNP and NPN transistors, which enables much easier formation of contact holes through the overlying oxide to expose the various regions for contact by a metal layer.

Other advantages will become apparent.

In this improved method, the P-type regions for both the PNP and the NPN transistor are initially defined using a single masking and etching step. Therefore, the emitter and collector region pattern for the PNP transistor is self-aligned with the base region of the NPN transistor. All the defined regions are then doped to achieve a desired NPN base region concentration.

In a next masking and etching step, a mask similar to the first mask, but oversized and modified to mask the base region of the NPN transistor, is simply aligned with respect to the initially defined emitter and collector regions of the PNP transistor. This masking step forms a layer of resist over the base region, and the remainder of the previous masking pattern is oversized to additionally define the emitter and collector regions of the PNP transistor.

P-type dopants are then implanted in the previously defined emitter and collector regions to form the heavily doped P++ emitter and collector regions of the PNP transistor. Thus, the P++ emitter and collector regions of the PNP transistor will be self-aligned with the P-type base region of the NPN transistor.

The P-type dopants in both the base region of the NPN transistor and the emitter and collector regions of the PNP transistor are then driven-in at the same time to diffuse and activate the dopants.

A next masking, etching, and doping step is used to form the N++ emitter region within the P-type base region of the NPN transistor and to form any N++ epitaxial layer contact region.

Since the resulting structure will have the P++ emitter and collector regions of the PNP transistor self-aligned with the P-type base region of the NPN transistor, the number of critical masking alignments necessary to form the components is reduced by one.

Further, the oxide thickness over the P-type base region and the N++ emitter region of the NPN transistor will be approximately identical to the oxide thickness over the P++ emitter and collector regions of the PNP transistor. This enables a much easier contact hole etch step.

An additional cost advantage in the above process is that the masking step for the injection of ions into the emitter and collection regions of the PNP transistor does not require any etching of oxide.

This process is also more economical, since the drive-in of the P++ emitter and collector regions and the P-type base region is conducted in the same step.

Accordingly, highly efficient PNP and NPN transistors are formed on a same substrate using a very economical and reliable fabrication process.

DETAILED DESCRIPTION OF THE PREFERRED EMBODIMENT

Figure 1:
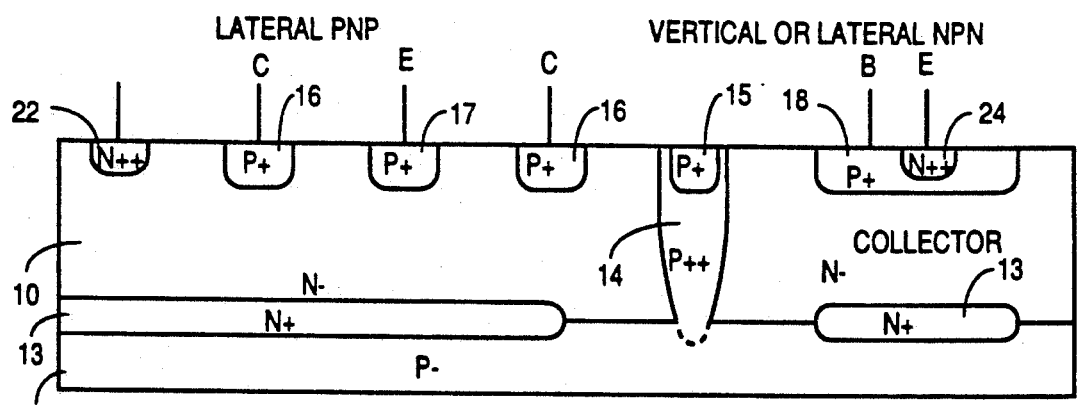
FIG. 1 is a cross-section illustrating a prior art PNP and NPN transistor formed in a same substrate.
Figure 2A:
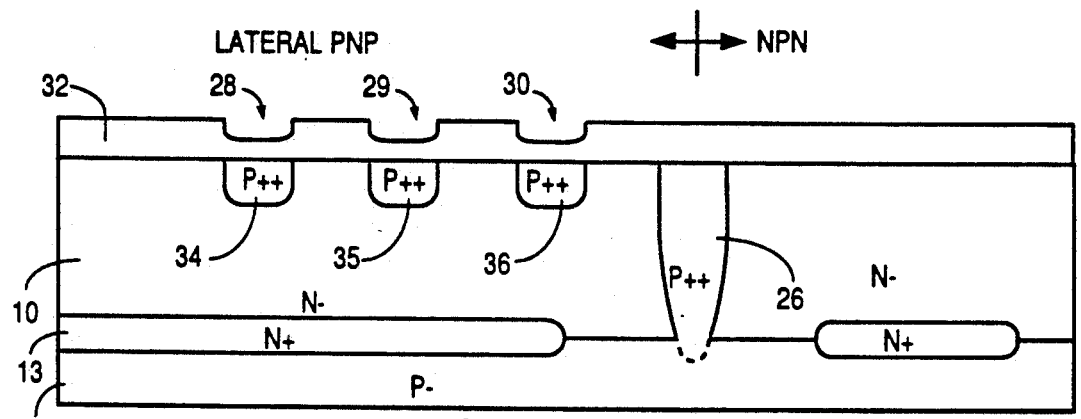
FIGS. 2A-2C illustrate one method for forming a more efficient PNP transistor and an NPN transistor on a same substrate.
Figure 2B:
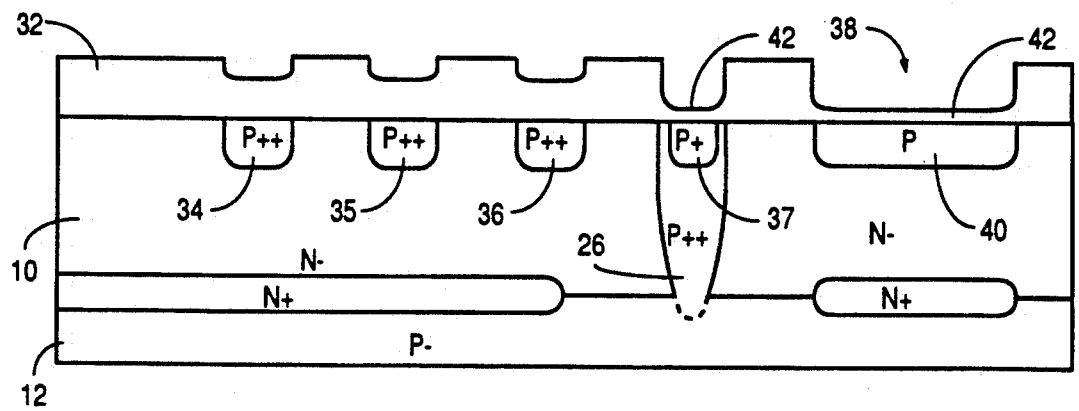
Figure 2C:
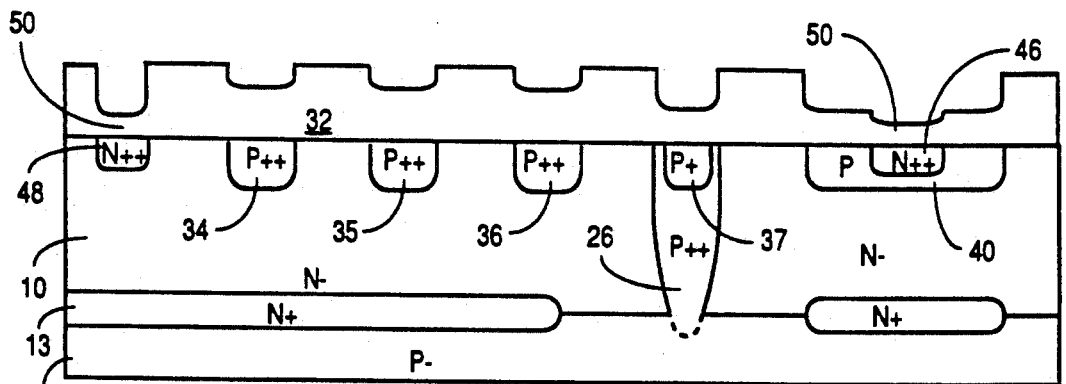
Figure 3:
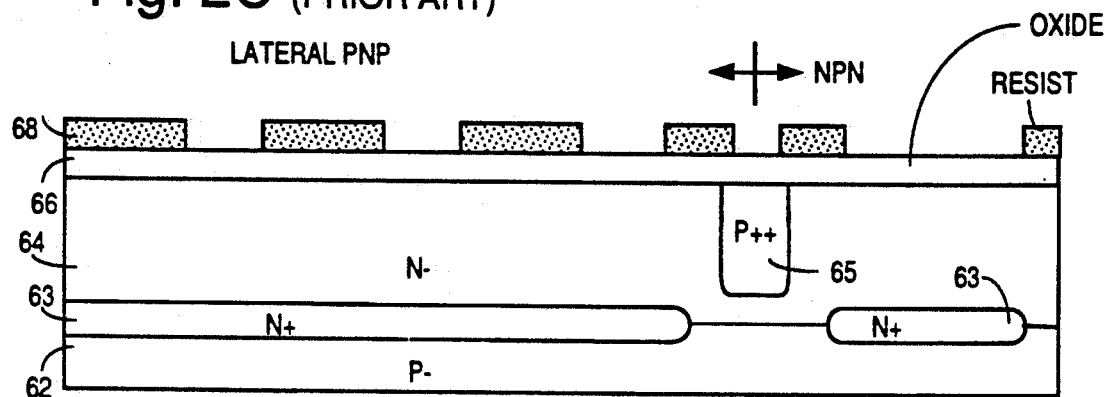
FIGS. 3-8 are cross-sections of a substrate illustrating the substrate after various steps during an improved method of forming an efficient PNP transistor and an NPN transistor in a same substrate in accordance with the preferred embodiment of the invention.
Figure 4:
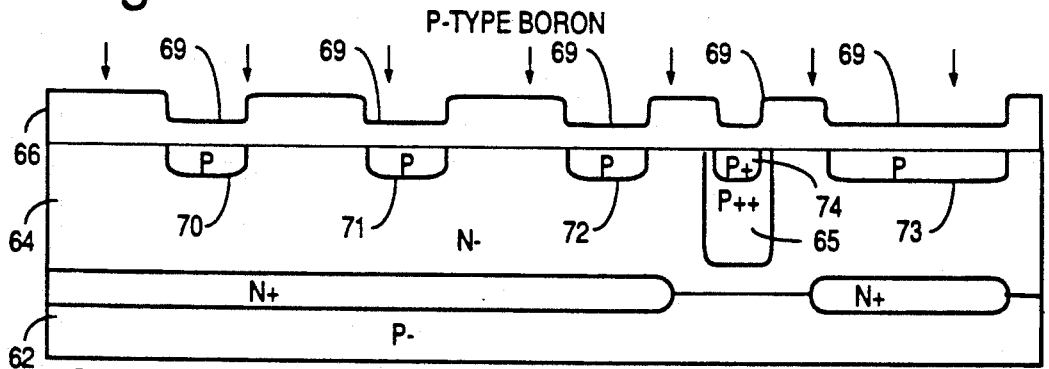
Figure 5:
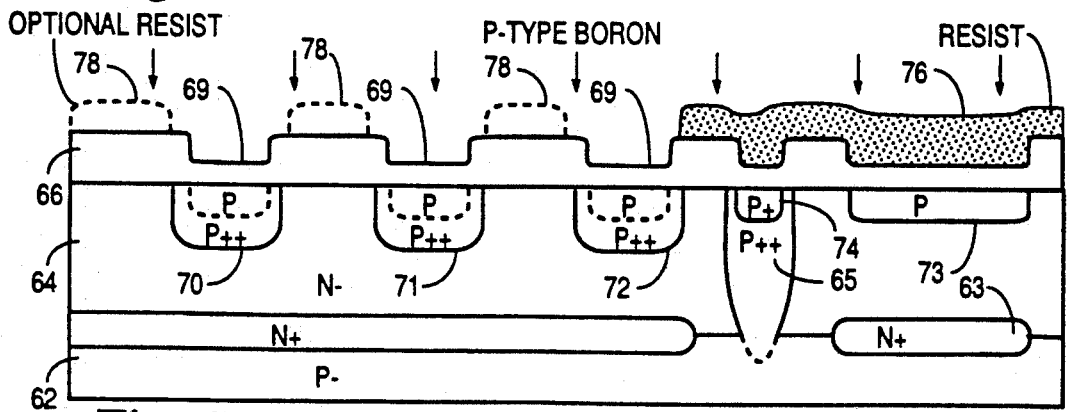

FIG. 3 shows a starting P− substrate 62 over which is formed N+ buried layer regions 63, using a first mask, and an N− epitaxial layer 64 using conventional techniques. Deep isolation regions, such as P++ isolation region 65, are then formed in a second masking step using conventional techniques. P++ isolation region 65 is shown extending partially down to substrate 62; a subsequent drive-in step (FIG. 5) causes the isolation region 65 to contact substrate 62 to provide the necessary isolation. FIGS. 3-5 illustrate a down-only diffusion method to form the isolation regions, although an up-down method may also be used.

To efficiently form a PNP transistor in a same substrate as an NPN transistor, a layer of oxide 66 approximately one micron thick is then grown or otherwise deposited on the surface of epitaxial layer 64, and a layer of resist 68 is then spun-on, exposed using a third mask, and developed to form the pattern shown in FIG. 3. The regions of epitaxial layer 64 underlying where resist 68 has been removed correspond to those regions where it is desired to deposit P-type dopants for the formation of P-type regions in the PNP transistor and the NPN transistor, and to form a contact region for the isolation region 65. The exposed oxide 66 is then etched away to expose top surface portions of epitaxial layer 64, and the resist 68 is stripped off.

Shown in FIG. 4, an oxide layer 69 having a thickness in the range of approximately 3000Å to 5000Å is grown over the exposed epitaxial layer 64 (during which time oxide layer 66 becomes even thicker), and P-type boron ions are then implanted through oxide layer 69 and into regions 70, 71, 72, 73, and 74 of epitaxial layer 64 using conventional methods. The thick oxide 66 blocks the ions from being implanted in the underlying epitaxial layer 64. In one embodiment, the amount of boron implanted is that necessary to achieve, after drive-in, a conductivity of between 100-200 ohms/square or an amount desired to obtain a suitable conductivity of base region 73, which will form the base of the NPN transistor. In one embodiment, boron is implanted at a dose of $5-7 \times 10^{14}$ ions/cm² and an energy of 160-200 keV.

During this step, unlike the prior art, a single composite masking step defines and self-aligns the base region 73 of the NPN transistor, the emitter region 71 of the PNP transistor, and the collector regions 70 and 72 of the PNP transistor.

At this point, the oxide 69 thicknesses over each of the P-type regions are identical.

In FIG. 5, a fourth masking and etching step is used to form a portion of resist 76 over base region 73 and, optionally, over isolation region 65/74. This forth mask may be a modified version of the third mask, where the NPN base geometry and isolation contact region geometry on the third mask are deleted to form resist portion 76, and, optionally, the PNP emitter and collector geometry on the third mask is oversized to form optional resist portions 78.

Boron ions are then implanted at a dose of approximately $6-9 \times 10^{15}$ ions/cm² and an energy of approximately 160-200 keV to form the deep P++ emitter region 71, the deep P++ collector regions 70 and 72, and, optionally, to additionally dope the contact region 74 for the isolation region 65.

Since thick oxide 66 acts as a mask to the boron ions, and oxide 66 was initially patterned along with base region 73, the P++ emitter and collector regions 70-72 as well as the contact region 74 are self-aligned with base region 73.

Additionally, depending upon the thickness of oxide 66 and the desired implantation energy, the optional portions of resist 78 over oxide 66 may be needed to block boron ions from entering the surface of the epitaxial layer 64 during the implantation step. Even so, the alignment of the fourth mask with respect to the existing openings in oxide 66 (formed using the composite third mask) enables an extremely easy and precise alignment of the fourth mask with respect to the emitter and collector regions 70, 71, and 72 and the base region 73. Thus, since all regions 70-74 are aligned in the third masking step, and the fourth mask (being a modified version of the third mask) is easily aligned with regions 70-74, the resulting PNP emitter and collector regions 70-72, as well as the contact region 74, are effectively self-aligned with the NPN base region 73.

During this fourth masking and etching step, no etching of any oxide is necessary, since the layer of oxide 69 over the exposed PNP emitter and PNP collector regions will not block the implantation of boron ions into epitaxial layer 64.

After the step of implanting boron ions, the dopants in regions 70-74 are then driven-in for the first time so as to diffuse and activate the dopants. This single drive-in for the P++ emitter and collector regions as well as the NPN base region and contact region saves significant processing time. FIG. 5 shows regions 70-74 diffused wider than the oxide openings, due to side diffusion. The dopants in P++ isolation region 65 are also further driven in this step to extend down to substrate 62.

Collector regions 70 and 72 are, in one embodiment, simply opposite sides of a single PNP collector ring surrounding P++ emitter region 71.

Figure 6:
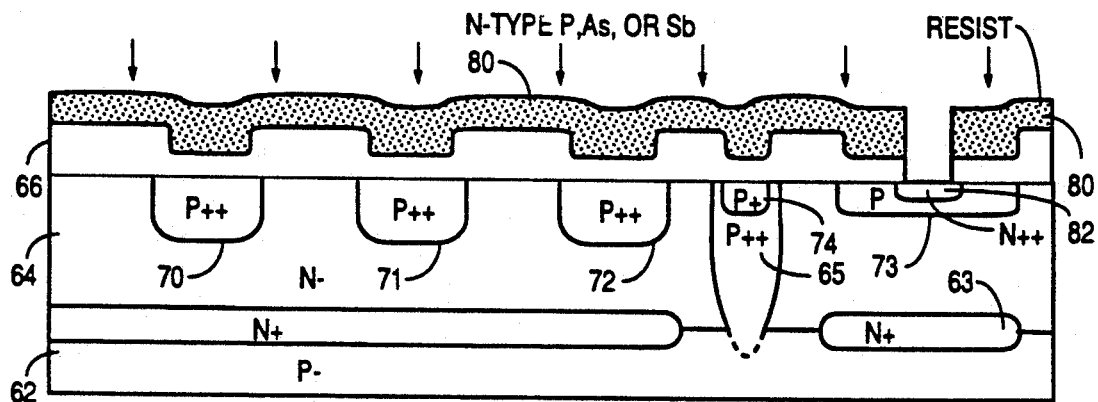

In FIG. 6, a fifth masking step is conducted wherein a layer of resist 80 is spun-on, exposed, and developed to expose an existing layer of oxide over base region 73 where an N++ emitter region 82 is to be formed. (Any desired N++ regions to act as PNP base or NPN collector contact regions for the N− epitaxial layer 64 tubs may also be formed along with the N++ emitter region 82; these regions will not be shown for simplicity.)

The exposed layer of oxide is then etched away, if a predeposition process is to be used, to expose the underlying epitaxial layer 64. If ion implantation is to be used to form N++ emitter region 82, the layer of oxide may be left on and the ions implanted through the exposed oxide. In a preferred embodiment, a predeposition process is used.

As shown in FIG. 6, an N-type dopant such as phosphorus, arsenic, or antimony is then deposited into the exposed area of epitaxial layer 64.

Figure 7:
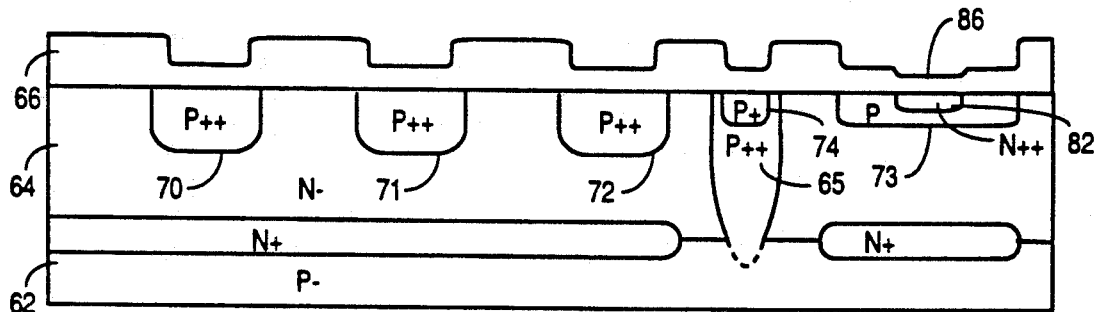

In FIG. 7, resist 80 is removed, and a layer of insulating oxide 86 is grown or deposited over N++ emitter region 82. The step of forming oxide layer 86 also increases the thickness of the oxide layer which already exists on the substrate. Since oxide grows faster on N+ regions than on P-type regions, the thickness of oxide 82 may be grown to be approximately the same thickness as the oxide above the various P-type regions 70-74 shown in FIG. 7. This enables the relatively simple etching of contact holes in the oxide 66 and 86 after a contact hole masking and etching step, wherein the various surface regions in epitaxial layer 64 are properly exposed so that deposited metal may reliably contact the exposed regions.

Figure 8:
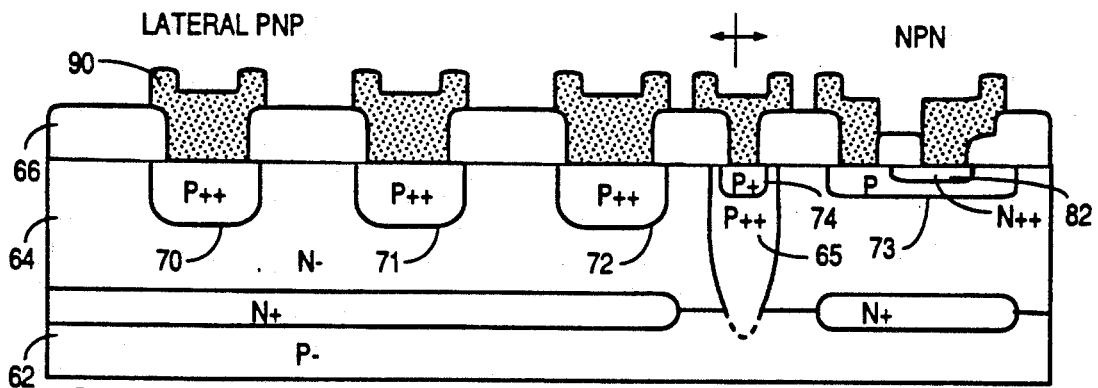

FIG. 8 shows the resulting wafer after the contact holes have been etched, a metal layer deposited, and the metal layer etched to form electrodes 90. In a preferred embodiment, the contact hole mask is preferably aligned with respect to the N++ emitter region 82 of the NPN transistor; however, in cases where a power PNP transistor is the major component, the contact hole mask is preferably aligned to the P++/P regions in FIG. 8.

The advantages of the above-described method include:

1) Only two critical mask alignments are required to form the PNP and NPN transistors—those being the alignment of the N++ emitter region 82 mask with respect to the P base region 73 and the alignment of the contact hole mask with respect to the various regions. This is a result of the self-alignment of the base region 73 of the NPN transistor and the emitter and collector regions 70-72 of the lateral PNP transistor.

2) Since the same thickness of oxide appears over each of the P-type regions 70-74 and this oxide may be made approximately the same as that over the N++ emitter region 82, the contact hole etching is generally made significantly easier and more reliable.

3) During the masking of the base region 73 in FIG. 5, there is no need to etch away any oxide, since the thick oxide 66 has been already patterned in a previous masking step. This saves a significant amount of processing time and expense.

4) The drive-in for all boron ions in the base region of the NPN transistor and the emitter and collector regions of the PNP transistor is conducted in a single drive-in step (i.e., co-driven), thus saving a significant amount of processing time. Also since only one diffusion cycle is used, better process control results, since controlling the NPN base depth automatically controls the PNP emitter and collector depth as a function of the doping levels.

5) And, the dopant concentrations in the base region and the emitter and collector regions are independent. Thus, the NPN transistor and PNP transistor efficiencies may be independently optimized.

A preferred process has been shown. The various conductivity types may be made opposite and the various processes for masking, deposition, etching, drive-in, etc. may be modified as necessary for a particular application. For example, the particular dimensions of the transistors shown in the various figures are purely for illustrative purposes only, and the above-described method is intended to be applicable to the formation of any type of PNP and NPN transistors formed in a substrate. Further, the teachings in this disclosure may be applicable to forming structures where P-type regions, such as P-type regions 70-74, are formed for any use and not just as regions in a transistor.

While particular embodiments of the present invention have been shown and described, it would be obvious to those skilled in the art that changes and modifications may be made without departing from this invention and his broader aspects and, therefore, the appended claims are to encompass within their scope all such changes and modifications as fall within the true spirit and scope of this invention.

What claimed is:

1. A method for forming high conductivity regions self-aligned with low conductivity regions in an epitaxial layer comprising the steps of:
    forming, over a substrate of a first conductivity type, a buried layer of a second conductivity and an epitaxial layer of said second conductivity type;
    forming an insulating layer on a top surface of said epitaxial layer;
    forming a first pattern in said insulating layer during a first masking step to define one or more first regions to be low conductivity regions and one or more second regions to be high conductivity regions;
    depositing dopants of said first conductivity type into said first and second regions as defined by said first masking step;
    masking said first regions in a second masking step to prevent dopants from being deposited into said first regions during a subsequent doping step;
    depositing dopants of said first conductivity type into said second regions and not into said first regions, so that said second regions are more highly doped than said first regions, while using said first pattern from said first masking step to self-align said highly doped second regions to said first regions.

2. The method of claim 1 further comprising the step of driving-in said dopants of a first conductivity type in both said first regions and said second regions to activate and diffuse said dopants to form said highly doped second regions and said first regions having a lower doping concentration than said second regions.

3. The method of claim 1 wherein said one or more first regions are to be base regions for one or more NPN transistors, and said one or more second regions are to be emitters for one or more PNP transistors.

4. The method of claim 3 further comprising the steps of:
    masking a portion of said first regions and masking an entirety of each of said second regions in a third masking step to only allow dopants of said second conductivity type to be deposited into a selected area of said first regions during a subsequent doping step; and
    depositing dopants of said second conductivity type into said selected area of said first regions where defined by said third masking step to form emitter regions of said NPN transistors within said base regions of said NPN transistors.

5. A method for forming PNP transistors and NPN transistors in a same epitaxial layer comprising the steps of:
    forming, over a substrate of a first conductivity type, a buried layer of a second conductivity type and an epitaxial layer of said second conductivity type;
    forming an insulating layer on a top surface of said epitaxial layer;
    forming a first pattern in said insulating layer during a first masking step to define one or more low conductivity base regions in a first type of bipolar transistor and one or more high conductivity emitter regions in a second type of bipolar transistor;
    depositing dopants of said first conductivity type into said base and emitter regions;
    masking said base regions in a second masking step to prevent dopants from being deposited into said base regions during a subsequent doping step;
    depositing dopants of said first conductivity type into said emitter regions and not into said base regions, so that said emitter regions are more highly doped than said base regions, while using said first pattern from said first masking step to self-align said highly doped emitter regions to said base regions;
    driving-in said dopants of said first conductivity type to activate and diffuse said dopants of a first conductivity type;
    masking a portion of said base regions and masking an entirety of said emitter regions to allow dopants to only be deposited into a selected area of said base regions during a subsequent doping step;
    depositing dopants of said second conductivity type into said selected area of said base regions to form an emitter region within each of said base regions in said first type of bipolar transistor;
    forming an insulating layer over said surface of said epitaxial layer; and
    forming contact holes in said insulating layer for the subsequent formation of electrodes contacting each of said emitters and base regions.

6. The method of claim 5 wherein collectors for said second type of bipolar transistor are formed concurrently with said emitters for said second type of bipolar transistor.

7. The method of claim 5 further comprising the step of forming a layer of oxide over said top surface of said epitaxial layer, after said step of depositing dopants of a first conductivity type into said base and emitter regions, and not etching said insulating layer prior to said step of depositing dopants of said first conductivity type into said emitter regions and not into said base regions.

8. The method of claim 5 further comprising the step of forming an insulating layer over said emitter region within each of said base regions prior to said step of forming contact holes so that said insulating layer will be approximately a same thickness over each of said base regions and said emitter regions.

* * * * *